United States Patent
Boudreau et al.

(10) Patent No.: US 6,490,379 B2
(45) Date of Patent: Dec. 3, 2002

(54) ELECTRICAL TRANSMISSION FREQUENCY OF SIOB

(75) Inventors: Robert A. Boudreau, Corning, NY (US); Songsheng Tan, Corning, NY (US); Christopher L. Henning, Corning, NY (US); Karen I. Matthews, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/850,359

(22) Filed: May 7, 2001

(65) Prior Publication Data

US 2002/0164107 A1 Nov. 7, 2002

(51) Int. Cl.[7] .................................................. G02B 6/36
(52) U.S. Cl. ........................................... 385/14; 385/88
(58) Field of Search ............................... 385/14, 88–94, 385/129–132

(56) References Cited

U.S. PATENT DOCUMENTS

| | | | |
|---|---|---|---|
| 4,600,907 A | * 7/1986 | Grellman et al. | 333/246 |
| 4,851,794 A | 7/1989 | Williams et al. | 333/33 |
| 5,133,676 A | 7/1992 | Hutchinson et al. | 439/581 |
| 5,138,480 A | * 8/1992 | Dolfi et al. | 359/251 |
| 5,256,996 A | 10/1993 | Marsland et al. | 333/20 |
| 5,267,020 A | * 11/1993 | Marsland et al. | 257/358 |
| 5,339,369 A | * 8/1994 | Hopfer et al. | 385/2 |
| 5,455,876 A | * 10/1995 | Hopfer et al. | 385/2 |
| 5,611,008 A | 3/1997 | Yap | 385/14 |
| 5,773,151 A | 6/1998 | Begley et al. | 428/446 |
| 5,777,528 A | * 7/1998 | Schumacher et al. | 333/33 |
| 5,895,742 A | * 4/1999 | Lin | 430/321 |
| 5,986,331 A | 11/1999 | Letavic et al | 257/664 |
| 6,023,209 A | 2/2000 | Faulkner et al. | 333/238 |
| 6,027,254 A | 2/2000 | Yamada et al. | 385/88 |
| 6,163,631 A | 12/2000 | Kawanishi et al. | 385/14 |
| 6,301,399 B1 | * 10/2001 | Mahapatra et al. | 385/2 |

FOREIGN PATENT DOCUMENTS

| | | | | |
|---|---|---|---|---|
| WO | WO 89/07833 | 8/1989 | | H01L/21/203 |

OTHER PUBLICATIONS

Transmission Line Capacitance Measurement, Williams, Dylan F., Marks, Roger B. IEEE Microwave and Guided Wave Letters vol. 1 No. 9 Sep. 1991.
Metal–Insulator–Semiconductor Transmission Lines, Williams, Dylan F., IEEE Transactions on Microwave Theory and Techniques, vol. 74, No. 2, Feb. 1999.
Characteristic Impedance of Microstrip on Silicon, Williams Dylan F., IEEE National Institute of Standard and Technology (No Date).
Quasi–TEM Model for Coplanar Waveguide on Silicon, Williams, Dylan F., Janezic Michael D., National Institute of Standards and Technology Oct. 1997.
Characterization of Broad–Band Transmission for Coplanar Waveguides on CMOS Silicon Substrates, Milanovic, Veljko, IEEE Trans. Of Microwave Theory and Techniques vol. 46, No. 5, May 1998.
Characterization of Coplanar Waveguide on Epitaxial Layers, Williams, Dylan F., IEEE National Institute of Standards and Technology.
Module Packaging for High–Speed Serial and Parallel Transmission, Karstensen, et al. IEEE Electronics Components and Technology Conference (No Date).

* cited by examiner

*Primary Examiner*—Brian Healy
*Assistant Examiner*—Kevin S Wood
(74) *Attorney, Agent, or Firm*—Juliana Agon

(57) ABSTRACT

An opto-electronic packaged platform (300) includes a high resistivity substrate (10) having an optical waveguide mounting portion (301), an optical device mounting portion (302), and an electrical waveguide portion (303) having a conductor pattern (312) and an underlying capacitance (330, 230, and/or 30) forming a transmission line (340) for propagating high frequency signals.

17 Claims, 3 Drawing Sheets

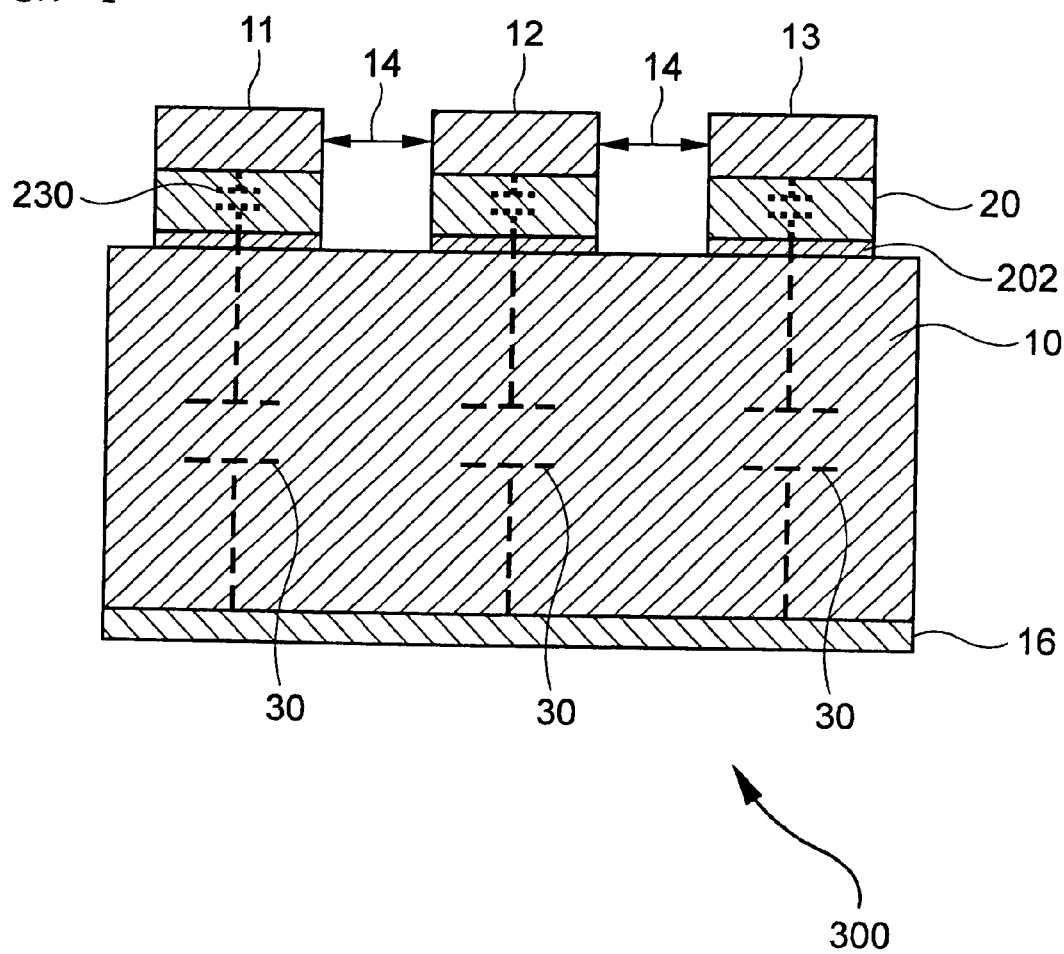

ELECTRICAL TRANSMISSION FREQUENCY
OF SIOB

BACKGROUND OF THE INVENTION

1. Field of the Invention

The present invention relates generally to silicon (Si) optical benches, and particularly to high frequency operational silicon optical benches for packaging optical communication or photonic devices.

2. Technical Background

Silicon optical benches (SiOB) are known and have been widely used to package photonic devices such as optical receiver modules and optical transmitter modules which combine and interconnect optical and electronic components (opto-electronic). In general, a silicon optical bench is a micro-optical system that includes one or more optical components that are fabricated on a silicon wafer by micro-mechanical technology. The optical components include optical mirrors, optical lenses, optical switches, and optical waveguides.

The increasing demand for bandwidth and data throughput of such opto-electronic modules leads to continuously increasing the desired operational frequency and speed of such modules, such as the high speed of 10 Gbits/s (or Gb/s) for OC192 modules and 40 Gbits/s for OC768 modules, as industry standards. Hence, there is a need for the development of higher speed components which can propagate the high speed signals without excessive transmission loss, such as a 40 Gbit/s optical module fabricated on a SiOB that can be easily and cost-effectively fabricated.

SUMMARY OF THE INVENTION

One aspect of the present invention is an opto-electronic packaged platform that includes a high resistivity substrate having an optical waveguide mounting portion, an optical device mounting portion, and an electrical waveguide portion having a conductor pattern and an underlying capacitance for forming a high frequency propagating transmission line.

In another aspect, the present invention includes removing the dielectric coated on top of the high resistivity substrate between the gap spacing of the coplanar waveguide conductors grown on top of the coated substrate.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 4 is a cross-sectional representation of one embodiment of the opto-electronic platform of FIG. 3 taken through line 340 in FIG. 3.

DETAILED DESCRIPTION OF THE PREFERRED EMBODIMENTS

Coplanar waveguide (CPW) structures are known to propagate high speed signals. However, the optimum CPW structure on an optical electronic integrated circuit (OEIC) package or platform such as a silicon optical bench (SiOB), a silicon wafer, or another supporting board or substrate is not known.

Figure 1:
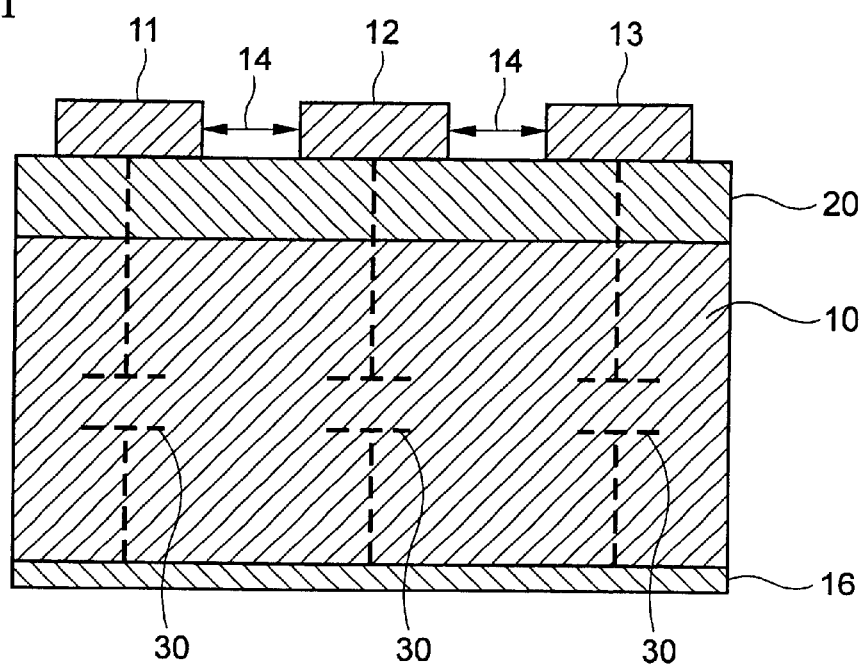
FIG. 1 is a conventional electrical model of a silicon waferboard supporting a coplanar waveguide (CPW)

Referring to FIG. 1, a simplified conventional electrical concept of a silicon waferboard supporting a coplanar waveguide (CPW) is represented. A silicon waferboard made of a high resistivity, float zone (FZ) silicon is used as a semiconductor substrate 10 to achieve maximum speed performance for the coplanar waveguides (CPW) 11, 12, 13 deposited on top of the substrate 10 to provide a center signal line with two flanking ground lines. Optionally, a backside ground plane 16 covers an underside of the substrate 10 to form a microstrip transmission line. Preferably fabricated from a 5 $\mu$m layer of gold, a center microwave signal conductor 12 is separated by a pair of opposed gaps 14 from the two outside RF ground conductors 11 and 13 to provide the coplanar waveguides. Since FZ silicon substrates have high resistivity, typically over 5000 $\Omega$-cm, the substrate 10 can be considered as an insulator. With this insulator, only a thin dielectric layer 20 of about 1–2 $\mu$m was conventionally thought to be needed for deposition on the top of the FZ substrate 10 as an insulative passivation layer. However, such a conventional design resulted in too much transmission loss.

A later approach suggested the use of a thicker dielectric layer of silicon dioxide $SiO_2$ of about 20–50 $\mu$m, disposed between the coplanar waveguides and a low resistivity substrate. This low resistivity substrate was grown using the Czochralski technique and is commonly termed a CZ wafer. This thicker dielectric layer on the CZ wafer has improved the operational frequency of the coplanar waveguides.

Even though the conventional teaching was to use a thicker dielectric on the CZ wafer to reduce transmission loss, a thinner dielectric layer was contemplated in the present invention for its ease of fabrication. This thin dielectric layer 20 disposed on the top of silicon substrate 10 was not expected, according to conventional thought, to change the high frequency performance of the coplanar waveguides 11, 12 13 due to the very small thickness of this dielectric layer 20 (approximately 2000 Angstroms or 2 $\mu$m) compared to the thickness of the substrate 10 (from 500 $\mu$m to 1 mm) where the parasitic capacitance 30 between two plates is related to the ratio of the area of the top plate over the distance between the two plates. In this assumed case, the parasitic capacitance 30 of the CPW would be very small and thus can be neglected. According to this electrical concept the transmission loss of the CPW 11, 12, 13 on the $SiO_2$/Si dielectric (20) covered substrate 10 should be nearly the same as the transmission loss on a bare Si substrate 10. However, measured results conflicted with this conventional theory of small parasitic capacitances.

Figure 2:
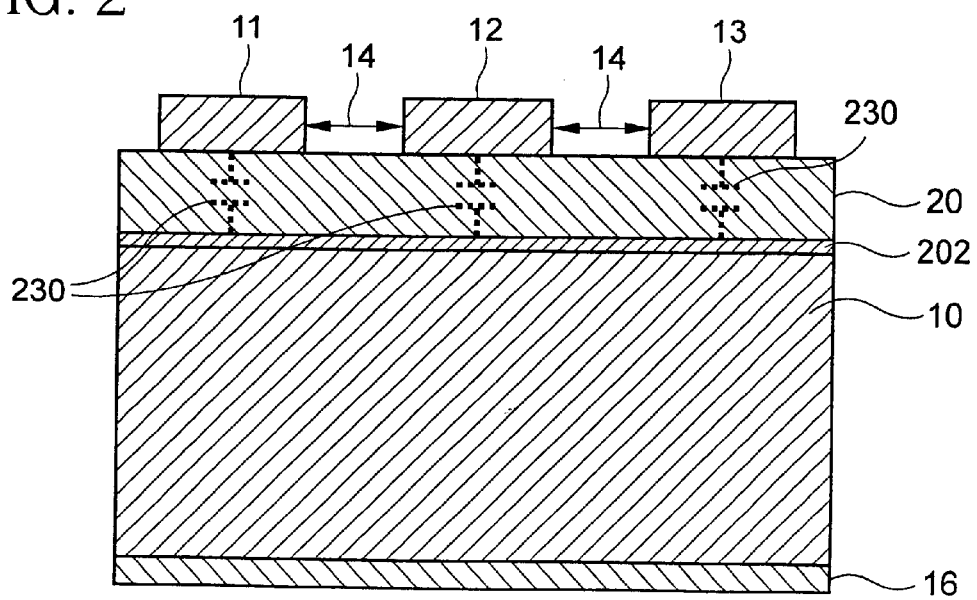
FIG. 2 is a modified electrical model of the silicon waferboard supporting a coplanar waveguide (CPW) of FIG. 2, according to the present invention.

Referring to FIG. 2, the simplified electrical concept of the silicon substrate 10 supporting the coplanar waveguide (CPW) 11, 12, 13 of FIG. 1 is modified, in accordance with the new teachings of the present invention. Unbeknownst conventionally, an interface state 202 exists between the dielectric layer 20 and the silicon substrate 10 which will alter the pre-conceived situation to create a very large parasitic capacitance, as shown in FIG. 2. The parasitic capacitances 230 inside the dielectric layer 20 will in effect become very large due to the small thickness of the dielectric layer 20, while causing the interstate layer 202 to become laterally conductive, serving as a virtual ground above the previous backside ground 16. According to this model of FIG. 2 and the area of the CPW 11, 12, 13 of FIG. 1, the calculated parasitic capacitance is about two orders of magnitude larger than the parasitic capacitance in the conventional electrical concept of FIG. 1. This large parasitic capacitance will impact the transmission or propagation of high speed or other microwave signals along the CPW 11, 12, 13. One possible cause of this interface state 202 is the undesired presence of metal alloys or other contaminants depurifying the dielectric layer 20 or occuring during the processing of dielectric layer 20 on top of the silicon substrate 10.

The evidence to support the existance of the interface state layer 202 is the low frequency capacitance measurement performed between the center conductor line 12 and one of the outside ground lines 11 of the CPW structure. The measured capacitance is comparable to the calculated value from the interface state concept of FIG. 2. Based on this and other experimental results, the impact of the layer 202 symbolizing the interface states between the dielectric layer 20 and the semiconductor substrate 10 on the transmission loss of the CPWs 11, 12, 13 is taught, by the teachings of the present invention, to be the key factor in limiting the operational or propagation frequency of the SiOB.

Reference will now be made in detail to the present preferred embodiments of the invention, examples of which are illustrated in the accompanying drawings. Wherever possible, the same reference numbers will be used throughout the drawings to refer to the same or like parts. An exemplary embodiment of the opto-electronic packaged platform of the present invention is shown in FIG. 3, and is designated generally throughout by reference numeral 300.

Figure 3:
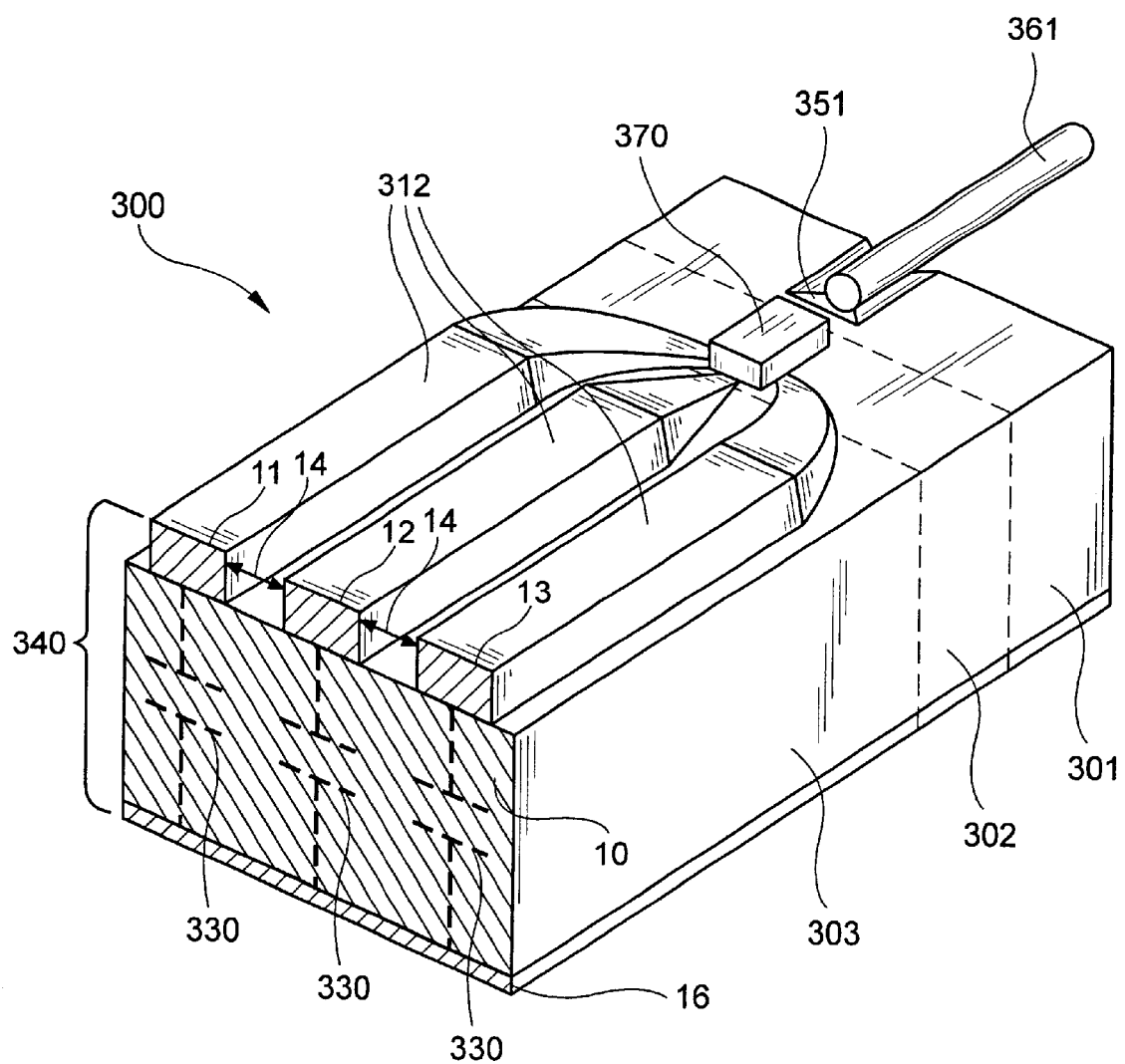
FIG. 3 is a perspective representation of an opto-electronic platform, according to the present invention.

Referring to FIG. 3, an opto-electronic packaged platform 300 includes a high resistivity substrate 10 having an optical waveguide mounting portion 301, an optical device mounting portion 302, and an electrical waveguide portion 303 having a conductor pattern 312 and an underlying capacitance 330 forming a transmission line 340 for propagating high frequency signals, from 2.5 GHz to above 40 GHz.

The substrate 10 is available from a silicon wafer supply company called TOPSILE and is preferably a (100) 4" N-type FZ wafer with the resistivity in the range from 2500 to 4000 Ω-cm and with the thickness of about 500 µm. A pattern 312 of 5 µm thick gold (Au) CPW conductor lines were deposited on the silicon FZ substrates 10 optionally coated with a thermal dielectric oxide innitially, in accordance with the teachings of the present invention.

Although the high resistivity substrate 10 is preferably a silicon waferboard, other low-loss semiconductor substrates can be used. Preferably, for better and easier optical coupling, the optical waveguide mounting portion 301 includes a "V" groove 351 disposed on the high resistivity substrate 10 for supporting an optical fiber 361. However, the optical mounting portion 301 and the fiber 361 can be combined into an optical waveguiding portion with core and cladding layers integral to the substrate.

Knowing about the interface state 202 and accounting for the interface state 202 and the resultant capacitance 230 of FIG. 2, the dimensions of the coplanar waveguide can be determined to provide a transmission line with the minimum thickness of the $SiO_2$ dielectric layer 20 to have a transmission loss less than −3 db/cm. The conductor pattern, provided by the conductors 11, 12, 13 and the dielectric pattern 20 formed underneath cause an interface state 202 between the dielectric pattern 20 and the high resistivity substrate 10 such that the coated dielectric pattern 20 provide at least a portion of the underlying capacitance 230 for coupling to the interface state 202 as a virtual ground for the transmission line.

Simulations using a commercial electromagnetic simulator software package, such as the ADS® circuit simulation tool, the HFSS® 3D Electro-Magnetic simulation tool, the ADS® microwave layout basics or others, available from software tool companies, such as Agilent, may be used to optimize the thickness of the dielectric layer 20, once the interface state is accounted for.

In general, a transmission loss of −3 db/cm is acceptable for an opto-electronic module having short coplanar waveguide lengths. Hence, the objective was to investigate what thickness of the dielectric $SiO_2$ layer 20 is necessary to have a transmission loss less than −3 db/cm.

A smooth transmission bandwidth of 40 GHz was measured with a silicon wafer having a 700 Angstrom (0.7 µm) thick of the dielectric SiO2 layer 20. Even though a high transmission loss resulted, the scattering (S) parameter curve S21 is the smoothest for a substrate coated with a uniform thickness of the thermal dielectric oxide layer 20. Varying uniform thickness of the dielectric layer 20 for the CPW pattern 312 deposited on the $SiO_2$ dielectric layer 20, which has been grown on the FZ silicon wafer 10 with a high resistivity between 2500 to 4000 Ω-cm were compared. The transmission loss is about −10 db/cm at 10 GHz on the $SiO_2$ coated Si substrates. When the thickness of the dielectric $SiO_2$ is about 1000 Angstrom or 1 µm, the transmission loss will be around −11 db/cm at 10 GHz. This loss means that the intensity of the signal will decrease by 99% after passing through a 1 cm long CPW line. Such a loss is too large to be acceptable. In order to keep the transmission loss around −3 db/cm, the thickness of the dielectric $SiO_2$ layer is taught to be over 1 µm for a 10 GHz operation and over 2 µm for 18 GHz operation.

Without accounting for the 2 µm thick dielectric, CPW structures were designed based on the conventional electric concept of FIG. 1 for operation at 40 GHz. Under this design concept, the distances of the gaps 14 between the center or signal conductor line 12 and the outside ground lines or conductors 11 or 13 are in the range between 60 µm to 235 µm depending on the shape and the width of the CPW structures, which could be rectangular, tapered, or of any other suitable shape.

One special CPW structure was designed based on the interface state concept represented in FIG. 2. The major parameter change in design used in the simulation was the thickness of the dielectric $SiO_2$ layer 20, which was assumed to be 2 µm. In contrast to the wider gap spacing of the conventional electrical concept designed with the same length of the coplanar waveguide lines at 10,000 µm, the special CPW structure 312 has a very narrow gap 14 of 10 µm, when the width of the center conductor was 210 µm and the width of the two outside ground conductors were both at 380 µm. However, due to processing problems in maintaining such a narrow gap spacing of 10 µm in contrast to a much wider center conductor width of 380 μm, the gold coplanar strip lines 312 on top of the dielectric layer 20 merged together for wafers with this thickness of $SiO_2$ layer of 2 μm. Hence, the gap 14 and the center conductor 12 width dimensions are process limited by the thickness of the dielectric ($SiO_2$) layer 20. As a result of this limitation, the measured impedance of such a CPW is centered around 30 ohms instead of the desired 50 ohms. Given a thicker dielectric, 50 ohm CPW lines should be achievable. Accounting for the interface state in the CPW structure, the transmission loss of about −3 db/cm at 40 GHz can be expected after revising the CPW design for achieving an impedance of 50 ohms.

To utilize the smooth high-frequency transmission bandwidth S21 curve for the wafers, a thinner $SiO_2$ layer is desired. By optimizing the process for coating a thinner than conventional dielectric layer, a coplanar gap spacing of even a narrower gap spacing 14 of 5 μm could be obtained to provide more flexibility in minimizing the dielectric thickness.

Preferably, taking current process limitations into account, using the interface state as a virtual ground or as part of a microstrip transmission line for operating at 50 GHz, the dimensions of the coplanar pattern 312 should have a center conductor 12 width=Gap 14=10 um, the substrate 10 when the dielectric layer 202 is 2 um. Hence, according to the teachings of the present invention, taking the interface state 202 into account, the dielectric thickness decreases in direct proportion to the decrease in the center conductor width.

Even though conventional silicon optical benches use a dielectric layer to reduce transmission loss, without accounting for the dielectric layer in the coplanar waveguide design, the present invention teaches that the transmission loss actually increases on a silicon substrate coated with the $SiO_2$ dielectric. Loss measurements were compared between the $SiO_2$/Si dielectric coated substrates and the Si uncoated substrates with the same CPW structure deposited on the 700 Angstrom thick $SiO_2$, which has been grown on FZ silicon wafer with high resistivity between 2500 to 4000 Ω-cm. Contrary to conventional thinking. The transmission loss decreased to about −1 db/cm on the uncoated Si substrates as compared to a higher transmission loss of about −10 db/cm at 10 GHz on the $SiO_2$/Si coated substrates. Hence, the existence of the interface state causes the transmission loss of the CPW lines to increase after having a $SiO_2$ dielectric layer 20 coated, thermally grown, or otherwise disposed on the top of the silicon substrate 10.

The variation in impedance of the CPW on the silicon substrate coated with $SiO_2$, across a frequency range of 500 MHz to 18 GHz is larger than that on an uncoated silicon substrate. This large impedance variation implies that the interface states are very active during the frequency scan. In other words, the dielectric caused the unexpected variation in interface states.

Referring back to FIG. 3, the optical device mounting portion 302 supports an optical device 320, such as a photodetector or a laser. A dielectric layer coated on the surface of the substrate is necessary for optical devices that are sensitive to the DC leakage current between the coplanar conductor lines, such as photo-detectors which require the direct current (DC) leakage current to be low in contrast to the in-sensitive high-speed lasers. To remove the interface state in order to reduce transmission loss, the present invention teaches the removal of this dielectric layer for use with high speed components where a low DC leakage is not critical. The same coplanar waveguide pattern 112 is disposed on a bare or uncoated high resistivity silicon substrate 10, such as a float zone (FZ) silicon wafer, without the dielectric oxide layer for the use with high speed devices, such as high speed lasers in a transmitter module. The high resistivity substrate 10 thus provides at least a portion of the underlying capacitance 330 that is much closer to the small capacitance 30 of FIG. 1 then the higher capacitance 230 of FIG. 2 for forming a transmission line with the above coplanar waveguide pattern 14 for propagating high frequency signals.

Referring to FIG. 4, a more detailed cross-sectional representation of FIG. 3 is shown for mounting optical devices 370 that are sensitive to DC leakage currents, such as a photo-detector in a receiver module. The CPW pattern 312 is disposed without the dielectric layer 20 in the gap area or spacing 14 between the metal lines 11, 12, 13 of the waveguide 312, while still having the dielectric layer 20 under the metal lines 11, 12, 13, to allow for high speed operation beyond 10 Gb/s without significant loss. The dielectric layer 20 is first thermally oxide grown on top of the substrate 10 before being etched away or otherwise removed between the metal lines 11, 12, 13 of the waveguide in order to achieve this improved performance. Thus, a key advantage of this design is that high speed performance is achieved while still having a dielectric layer 20 interposed between the metal lines 11, 12, 13 and the silicon substrate 10 for optical devices that require very low direct current (DC) leakage currents, such as photodetectors. This interrupted dielectric layer 20 helps to cut the path of the DC leakage.

After the dielectric layer 20 is removed in the gap 14 between the CPW, the interface states 202 will disappear in the gap 14 between the CPW. The capacitance 230 of the CPW within the dielectric layer 20 will no longer be connected together through the interface states 202 between them to form the previous virtual ground of FIG. 2. The dielectric capacitances 230 will each connect in series with the second capacitances 30 inside the substrate 10. Hence, the total parasitic capacitance of the conductor lines will become approximately to the value of the dielectrica capacitance 30, which is very small, according to the conventional concept model as shown in FIG. 1. As a result, the transmission loss of the CPW will be back to the value closer to that of the bare wafer 10 of FIG. 3. Eliminating the gap region 14 of the dielectric 20 thus reduces the apparent capacitance and improves wave propagation performance. The removal of this dielectric 20 in the gaps 14 "breaks-up" the conduction path or the virtual ground of interface states 202 along the interface between the silicon substrate 10 and the dielectric layer 20, thereby reducing the effective area of this sheet of conduction of the virtual ground and allowing for reduced capacitance.

The process to remove the dielectric in the gap is simple, especially for a thin $SiO_2$ dielectric layer. When the thickness of the dielectric $SiO_2$ layer 20 is about 1000 Angstroms or 1 μm, using the standard reactive ion etch (RIE) process, the etching time for removing the $SiO_2$ is only about 4 minutes. In this case, the Au plated CPW line itself can act as a mask without deterioration during the RIE etching.

The S-parameter measurement results for the CPW deposited on a silicon substrate innitally coated with 700 Angstrom or 0.7 μm of the dielectric $SiO_2$ and having the $SiO_2$ removed from the gaps 14 of the CPW lines are more similar to the results of the bare silicon substrate. The transmission loss for the gap-dielectric substrate was about −1.2 db/cm at 10 GHz which is closer to the about −1 db/cm loss on the uncoated Si substrates as compared to the higher transmission loss of about −10 db/cm at 10 GHz on the SiO$_2$/Si coated substrates. This comparison indicates that the transmission loss and the impedance of the CPW on the SiO$_2$/Si substrates will return to the values of the CPW on bare Si substrates after removing the dielectric layer in the gaps 14 between the CPW lines. Similar results of acceptable transmission losses were obtained from other wafers with the SiO$_2$ thickness of 0.99 μm and 1.7 μm.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An opto-electronic platform, comprising:
   a high resistivity substrate having an optical waveguide mounting portion,
   an optical device mounting portion, and
   an electrical waveguide portion having a conductor pattern and an underlying capacitance forming a transmission line for propagating high frequency signals, wherein the electrical waveguide portion comprises the conductor pattern and a dielectric pattern remaining only underneath the conductor pattern, the dielectric pattern disposed on the high resistivity substrate for providing at least a portion of the underlying capacitance.

2. An opto-electronic platform, comprising:
   a high resistivity substrate having an optical waveguide mounting portion,
   an optical device mounting portion, and
   an electrical waveguide portion having a conductor pattern and an underlying capacitance forming a transmission line for propagating high frequency signals, wherein the electrical waveguide portion comprises a coplanar waveguide disposed directly on the high resistivity substrate wherein the high resistivity substrate provides at least a portion of the underlying capacitance.

3. The platform of claim 1, wherein the dielectric pattern has a thickness less than 20 μm.

4. The platform of claim 3, wherein the conductor pattern comprises a coplanar waveguide having a center conductor and a surrounding pair of RF ground conductors separated from the center conductor by a gap spacing of less than 20 μm.

5. The platform of claim 1, wherein the dielectric pattern has a thickness about 2 μm.

6. The platform of claim 5, wherein the conductor pattern comprises a coplanar waveguide having a center conductor and a surrounding pair of RF ground conductors separated from the center conductor by a gap spacing about the width of the center conductor.

7. The platform of claim 1 wherein the optical waveguide mounting portion comprises a "V" groove disposed on the high resistivity substrate for supporting an optical fiber.

8. The platform of claim 1, further comprising:
   a laser for mounting on the optical device mounting portion.

9. The platform of claim 2 further comprising:
   a laser for mounting on the optical device mounting portion.

10. The platform of claim 1 further comprising:
    a photodetector for mounting on the optical device mounting portion.

11. The platform of claim 1, further comprising:
    a photodetector for mounting on the optical device mounting portion.

12. The platform of claim 1, wherein the high resistivity substrate comprises a silicon wafer.

13. The platform of claim 1, wherein the high resistivity substrate having the underlying capacitance for forming the transmission line for propagating signals at a minimum speed of 40 Gbits/s.

14. A method for making a high-speed propagating platform, comprising the steps of:
    providing a high resistivity substrate having an electrical waveguide portion;
    thermally oxide coating a dielectric over the high resistivity substrate;
    growing a metallized coplanar waveguide pattern having a center conductor and a surrounding pair of RF ground conductors separated from the center conductor by a gap spacing over the dielectric oxide; and
    removing the dielectric oxide on top of the high resistivity substrate in the gap spacing.

15. The method of claim 14 wherein the step of removing includes etching.

16. The method of claim 14 wherein the step of removing includes reactive ion etching.

17. The method of claim 14 wherein the step of removing includes reactive ion etching away the dielectric for less than ten minutes.

* * * * *